US009190603B2

(12) United States Patent
    Colli et al.

(10) Patent No.: US 9,190,603 B2
(45) Date of Patent: Nov. 17, 2015

(54) PIEZOELECTRIC GENERATING WITH LOCATION SIGNALING

(71) Applicant: Nokia Corporation, Espoo (FI)

(72) Inventors: Alan Colli, Cambridge (GB); Richard White, Huntingdon (GB)

(73) Assignee: Nokia Technologies Oy, Espoo (FI)

( * ) Notice: Subject to any disclaimer, the term of this patent is extended or adjusted under 35 U.S.C. 154(b) by 416 days.

(21) Appl. No.: 13/855,862

(22) Filed: Apr. 3, 2013

(65) Prior Publication Data

US 2014/0300251 A1    Oct. 9, 2014

(51) Int. Cl.
   *H01L 41/113*    (2006.01)
   *H01L 41/25*     (2013.01)
   *H02N 2/18*      (2006.01)
   *G06F 3/0354*    (2013.01)
   (Continued)

(52) U.S. Cl.
   CPC .............. *H01L 41/25* (2013.01); *G06F 1/163* (2013.01); *G06F 3/03547* (2013.01); *G06F 3/045* (2013.01); *H01L 41/113* (2013.01); *H02N 2/18* (2013.01); *Y10T 29/42* (2015.01)

(58) Field of Classification Search
   CPC ............... H04R 17/00; G10K 11/002; H01H 2239/076; H01H 2300/03; H03H 9/77; H02N 2/186
   USPC .................................. 310/314, 318, 319, 339
   See application file for complete search history.

(56) References Cited

U.S. PATENT DOCUMENTS

| 5,883,419 A | 3/1999 | Lee et al. ............... 257/417 |
| 8,288,923 B2 | 10/2012 | Vaidyanathan et al. ...... 310/339 |
| 2009/0303400 A1 | 12/2009 | Hou et al. .................. 349/12 |

(Continued)

FOREIGN PATENT DOCUMENTS

| CN | 201689405 U | 12/2010 |
| WO | WO-9833193 A1 | 7/1998 |
| WO | WO-2011/156447 A1 | 12/2011 |

OTHER PUBLICATIONS

M.-Y. Choi, D. Choi, M.-J. Jin, I. Kim, S.-H. Kim, J.-Y. Choi, S. Y. Lee, J. M. Kim, and S.-W. Kim, "*Mechanically Powered Transparent Flexible Charge-Generating Nanodevices with Piezoelectric ZnO Nanorods*", Adv. Mater. 21, 2185 (2009) (5 pages).

D. Bloor, A. Graham, E. J. Williams, P. J. Laughlin, D. Lussey. "*Metal-polymer composite with nanostructured filler particles and amplified physical properties*", Appl. Phys. Lett. 88, 102103 (2006) (3 pages).

(Continued)

*Primary Examiner* — Thomas Dougherty
(74) *Attorney, Agent, or Firm* — Harrington & Smith

(57) ABSTRACT

An apparatus including a piezoelectric convertor layer; at least one piezoresistive layer on the piezoelectric convertor layer; and electrical conductor outputs. The at least one piezoresistive layer includes a plurality of spaced apart piezoresistive electrodes. The apparatus is configured such that when the piezoelectric convertor layer is deformed to generate a charge, at least one of the piezoresistive electrodes is stressed, where the at least one piezoresistive layer is configured to control flow of charge from the piezoelectric convertor layer. The electrical conductor outputs are electrically connected to the piezoresistive electrodes. The outputs are configured to allow the charge from the piezoelectric convertor layer to flow out of the piezoresistive electrodes. The electrical conductor outputs are configured relative to the piezoresistive electrodes to allow identification of the at least one piezoresistive electrode which has been stressed based upon the charge on at least one of the electrical conductor outputs.

20 Claims, 13 Drawing Sheets

(51) Int. Cl.
*G06F 1/16* (2006.01)
*G06F 3/045* (2006.01)

(56) References Cited

U.S. PATENT DOCUMENTS

| | | | |
|---|---|---|---|
| 2010/0073997 A1 | 3/2010 | Elmegreen et al. | 365/157 |
| 2011/0080069 A1* | 4/2011 | Cueff et al. | 310/328 |
| 2011/0285660 A1 | 11/2011 | Prabhu et al. | 345/174 |
| 2012/0225196 A1 | 9/2012 | Choi et al. | 427/74 |
| 2012/0256838 A1 | 10/2012 | Lee et al. | 345/168 |

OTHER PUBLICATIONS

Bourzac, Katherine; "Self-Powered Flexible Electronics," http://www.technologyreview.in/computing/25219/; Friday, Apr. 30, 2010 (2 pages).

Radhika Seth;"The Power of Touch," http://www.yankodesign.com/2011/05/26/the-power-of-touch/; May 26, 2011 (6 pages).

Choi, Dukhyun, et al.; "Fully Rollable Transparent Nanogenerators Based on Graphene Electrodes"; 2010; Adv. Mater. 22; pp. 2187-2192.

* cited by examiner

Insulator

PIEZOELECTRIC GENERATING WITH LOCATION SIGNALING

BACKGROUND

1. Technical Field

The exemplary and non-limiting embodiments relate generally to piezoelectric charge generation.

2. Brief Description of Prior Developments

Piezoelectricity is the electric charge that accumulates in certain solid materials (notably crystals, and certain ceramics) in response to applied mechanical stress. The piezoelectric effect may provide internal generation of electrical charge resulting from an applied mechanical force. Devices comprising a piezoelectric member are known. The piezoresistive effect describes change in electrical resistivity of a member when mechanical stress is applied. In contrast to the piezoelectric effect, the piezoresistive effect only causes a change in electrical resistance; not in electric potential.

SUMMARY

The following summary is merely intended to be exemplary. The summary is not intended to limit the scope of the claims.

In accordance with one aspect, an example embodiment comprises an apparatus including a piezoelectric convertor layer; at least one piezoresistive layer on the piezoelectric convertor layer; and electrical conductor outputs. The at least one piezoresistive layer includes a plurality of spaced apart piezoresistive electrodes. The apparatus is configured such that when the piezoelectric convertor layer is deformed to generate a charge, at least one of the piezoresistive electrodes is stressed, where the at least one piezoresistive layer is configured to control flow of charge from the piezoelectric convertor layer. The electrical conductor outputs are electrically connected to the piezoresistive electrodes. The outputs are configured to allow the charge from the piezoelectric convertor layer to flow out of the piezoresistive electrodes. The electrical conductor outputs are configured relative to the piezoresistive electrodes to allow identification of the at least one piezoresistive electrode which has been stressed based upon the charge on at least one of the electrical conductor outputs.

In accordance with another aspect, an example method comprises providing a piezoelectric convertor layer; providing at least one piezoresistive layer in electrical communication with the piezoelectric convertor layer, where the at least one piezoresistive layer comprises a plurality of discrete, spaced apart piezoresistive electrodes, such that when the piezoelectric convertor layer is deformed to generate a charge, at least one of the piezoresistive electrodes is stressed for the piezoresistive layer to control flow of charge from the piezoelectric convertor layer; and providing a plurality of separate electrical outputs from the piezoresistive electrodes, where a first one of the outputs is connected to at least two of the piezoresistive electrodes and a second one of the outputs is connected to at least two different ones of the piezoresistive electrodes.

In accordance with another aspect, an example embodiment comprises a piezoelectric convertor layer; a first piezoresistive layer which is in electrical communication with a first face of the piezoelectric convertor layer, where the first piezoresistive layer comprises a plurality of discrete, spaced apart first piezoresistive electrodes, where the apparatus is configured such that when the piezoelectric convertor layer is deformed to generate a charge, at least one of the first piezoresistive electrodes is stressed such that the first piezoresistive layer controls flow of charge from the piezoelectric convertor layer; and a plurality of separate electrical outputs from the first piezoresistive electrodes, where a first one of the outputs is connected to at least two of the first piezoresistive electrodes and a second one of the output is connected to at least two different ones of the first piezoresistive electrodes.

BRIEF DESCRIPTION OF THE DRAWINGS

The foregoing aspects and other features are explained in the following description, taken in connection with the accompanying drawings, wherein:

FIG. 4 is a circuit diagram corresponding to the example shown in FIG. 3;

DETAILED DESCRIPTION OF EMBODIMENTS

Figure 1:
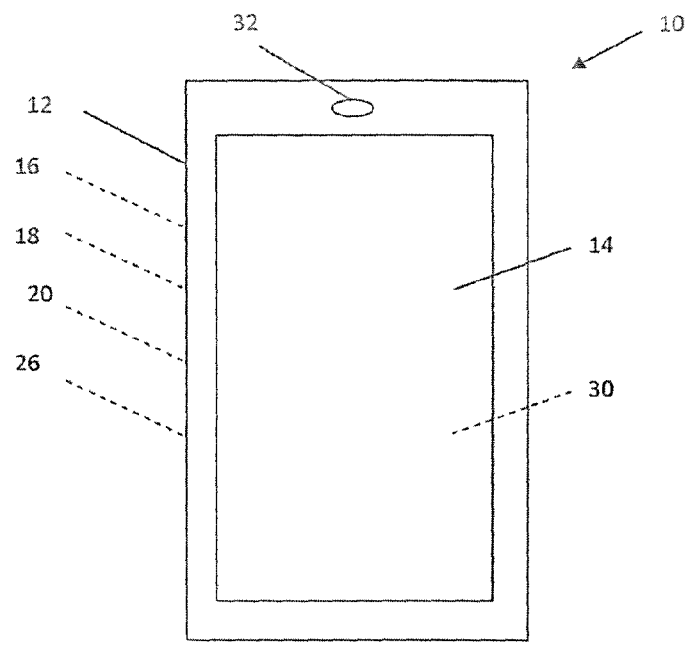
FIG. 1 is a front view of an example embodiment of an apparatus.

Referring to FIG. 1, there is shown a front view of an apparatus 10 incorporating features of an example embodiment. Although the features will be described with reference to the example embodiments shown in the drawings, it should be understood that features can be embodied in many alternate forms of embodiments. In addition, any suitable size, shape or type of elements or materials could be used.

Figure 2:
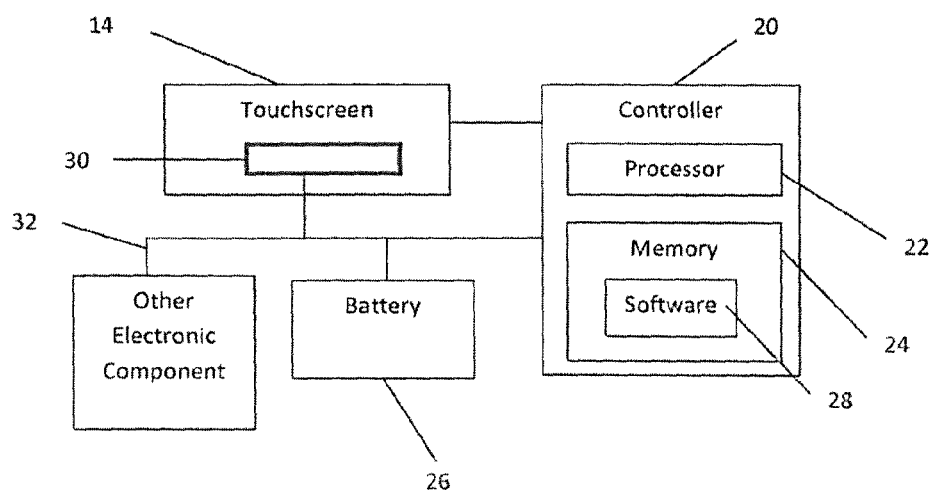
FIG. 2 is a diagram illustrating some of the components of the apparatus shown in FIG. 1.

The apparatus 10 is a hand-held communications device which includes a telephone application. In an alternate example the apparatus might not comprise a telephone application. In the example shown in FIG. 1, the apparatus 10 may also comprise an Internet browser application, camera application, video recorder application, music player and recorder application, email application, navigation application, gaming application, and/or any other suitable electronic device application, such as may be provided on a smartphone or tablet computer for example. Referring to both FIGS. 1 and 2, the apparatus 10, in this example embodiment, comprises a housing 12, a display 14, a receiver 16, a transmitter 18, a rechargeable battery 26, and a controller 20 which may include at least one processor 22, at least one memory 24, and software 28. However, all of these features are not necessary to implement the features described below. For example, features as described herein may be used in a non-portable apparatus which does not have a battery.

The display 14, in this example, is a touch screen display which functions as both a display screen and as a user input. However, features described herein may be used in a display which does not have a touch, user input feature. Alternatively, another example may comprise an apparatus which has a touchpad or touch-panel which is not part of an electronic display screen. The electronic circuitry inside the housing 12 may comprise a printed wiring board (PWB) having components such as the controller 20 thereon. The circuitry may include a sound transducer provided as a microphone and a sound transducer 32 provided as a speaker and/or earpiece.

The receiver 16 and transmitter 18 form a wireless mobile communication interface to allow the apparatus 10 to communicate with a wireless telephone system, such as a mobile telephone base station for example. The wireless mobile communication interface 16, 18 may allow the apparatus 10 to communicate such as by 4G, 4G LTE, 3G, CDMA, etc. for example. However, in an alternate example embodiment the receiver 16 and transmitter 18 might not be provided, such as when the apparatus 10 does not have telephone capabilities. For example, the apparatus 10 might merely be a gaming device, or a music/video player, or a user handset for a television console. Internet access for the apparatus 10 might be provided by a short range communications system through the television console or a wireless WLAN for example. These are only some examples, and should not be considered as limiting.

An apparatus comprising features as described herein may be applicable to a broad range of applications, which may include for example: integration into shoes for energy harvesting from walking/running; integration into chairs or clothes for energy harvesting from movement; an at least partially self-powered touch screen; at least partially self-powered wireless sensors (e.g., automotive-powered sensors in tires); devices to harvest wind energy; devices integrated into flooring to harvest energy from people walking; integration with an inertial mass to harvest energy from accelerations such as for a vehicle; and integration within the body of a device to harvest energy from squeezing. These are only examples and should not be considered as limiting.

The apparatus 10 in this example comprises at least one generator 30 for generating electricity based upon piezoelectricity. The generator(s) 30 in this example is a piezo-electric harvester/apparatus. The generator(s) may be integrated with or behind the touchscreen 14 for example. Electricity generated by the generator(s) 30 may be used by the touchscreen 14, and/or stored in the battery 26, and/or supplied to the controller 20 and/or another electronic component of the apparatus as symbolized by the bus line 32 in FIG. 2.

Figure 3A:
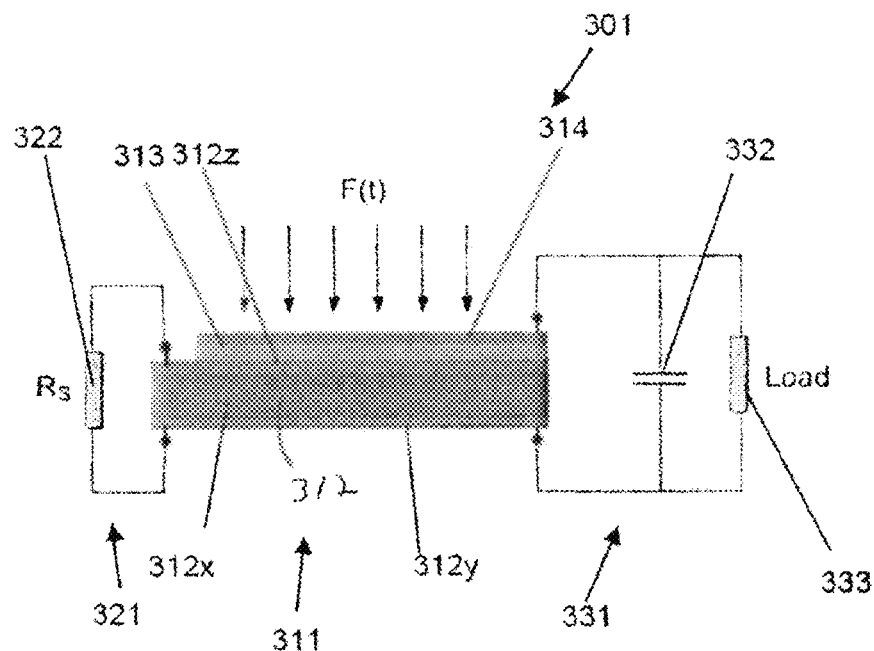
FIG. 3 is a schematic diagram illustrating an example of components of the apparatus shown in FIG. 1.
Figure 3B:
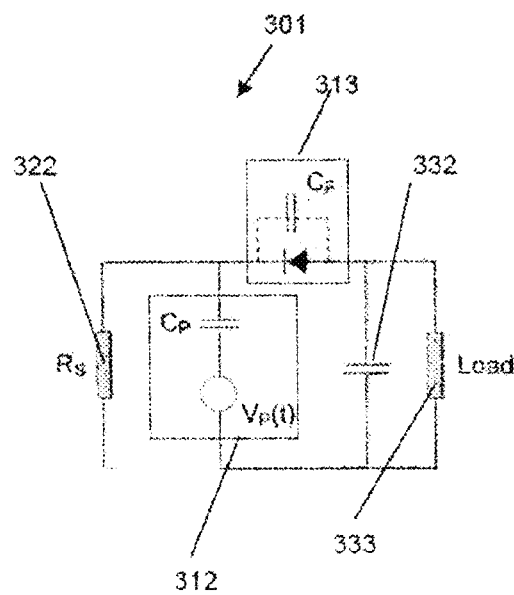

Referring also to FIG. 3A, an example embodiment 301 of the generator or piezo-electric harvester/apparatus 30 is shown. The corresponding equivalent circuit is shown in FIG. 3B. In this example embodiment the generator 30 comprises a piezoelectric convertor layer 312; and a proximal first piezoresistive layer 313 (which in this case is a positive piezoresistive layer). The piezoresistive layer 313 is in electrical communication with a first face of the piezoelectric convertor layer 312, such that when the piezoelectric convertor layer 312 is deformed to generate charge, the piezoresistive layer 313 is also deformed and is configured to control the flow of the charge from the piezoelectric convertor layer 312.

In this case, the proximity of the piezoelectric convertor layer 312 and the piezoresistive layer 313 is such that they are in direct physical contact. Deformation of the piezoelectric convertor layer 312 causes a deformation in the piezoresistive layer 313. Deformation of the piezoresistive layer 313 changes the resistance of the piezoresistive layer compared to its non-deformed state. The flow of charge from the piezoelectric convertor layer to the storage circuit portion 331 is limited to a path though the piezoresistive layer as further described below. Thus, changing the resistance of the piezoresistive layer 313 by deformation, enables the piezoresistive layer 313 to control the flow of charge from the piezoelectric convertor layer 312.

The first piezoresistive layer 313 in this example is a positive piezoresistive layer. That is, the resistance of the first piezoresistive layer, which may be a metal-insulator composite for example, decreases in response to mechanical stress. The positive piezoresistive layer is coated with a conducting layer 314 forming an electrode to enable an electrical connection with other circuit portions.

In this example, the piezoelectric convertor layer 312 comprises a piezoelectric layer 312$x$; a first conducting layer 312$z$ (such as a metallic layer for example); and a second conducting layer 312$y$ (such as a metallic layer for example). The first conducting layer 312$z$ in this example is in direct electrical communication with a first face of a piezoelectric layer 312$x$. The second conducting layer 312$y$ in this example is in direct electrical communication with an opposing second face of the piezoelectric layer 312$x$. It will be appreciated that one or more of the conducting layers 312$y$, 312$z$ need not be metallic. For example, a conducting layer comprising graphene film may be provided.

Because the piezoresistive layer 313 is integrated with the piezoelectric convertor layer 312, the layered structure 311 comprising the piezoelectric convertor 312 and the piezoresistive layer 313 may be manufactured as a single laminated foil without any external circuitry. For example, roll-to-roll production may be used.

The layered structure 311 is connected to two circuit portions: an equalizing circuit portion 321 comprising a resistor 322, and a storage circuit portion 331 comprising a storage capacitor 332. The storage circuit portion 331 is electrically connected to the first face of the piezoelectric convertor layer 312 at the first conducting layer 312$z$ via the first piezoresistive layer 314. The storage circuit portion 331 is also electrically connected to the opposing second face of the piezoelectric convertor layer at the second conducting layer 312$y$. The storage circuit portion 331 is configured to store charge generated by the piezoelectric convertor layer 312. The equalizing circuit portion 321 is connected to the first face of the piezoelectric convertor layer 312 at the first conducting layer 312$z$, and the opposing second face of the piezoelectric convertor layer 312 at the second conducting layer 312$y$. The second circuit equalizing portion 321 is configured to enable charge to be equalized between the opposing first and second faces of the piezoelectric convertor layer. These circuit portions may be external circuit portions or integrated with the layered structure.

As stress or force F(t) is applied to the piezoelectric converter layer 312, a field forms at both faces of the piezoelectric material 312x. This results in an accumulation of charge in the two conducting layers 312y, 312z forming a parallel-plate capacitor. When under pressure, the positive piezoresistive layer 313 conducts better than the equalizing circuit portion 321 having the resistor 322 $R_s$. Thus, current flows principally in the right storage branch (the storage circuit portion 331) of the circuit. The piezo-capacitor CP (representing the intrinsic capacitance of the piezoelectric convertor layer 312) can charge up only by moving charge to/from the storage capacitor 332 CL (current through the higher-impedance load 333 may be negligible). When the stress/force F is released, the electric field holding the charge on the conducting plates is removed, so the charge should dissipate or discharge. However, it cannot do so via the right storage circuit portion 331 which is blocked because the positive piezoresistive layer 313 has reduced conductivity. The left equalizing branch 321 of the circuit, however, which does not incorporate the positive piezoresistive layer 313, remains available for discharging the conducting plates 312y, 312z of the piezoelectric convertor layer 312. That is, resistance of the piezoresistive layer (RP) under stress satisfies RP ≪ $R_S$, and resistance of the piezoresistive layer (RP) when unstressed satisfies $R_S$ ≪ RP.

It will be appreciated that the positive piezoresistive layer 313 may be considered to be a diode in the respect of the use described above. However, a piezoresistive layer is not directly equivalent to an electrical diode, as its conductivity imbalance is driven by mechanical stress and not by the electrical bias applied across it. In this particular example embodiment, any reverse in bias always occurs in phase with the application of stress. Therefore, the piezoresistive layer is found in the conductive state for one current polarity only; mimicking the behavior of a semiconductor diode. The piezoresistive layer may also be considered similar to a pressure activated switch which is opened and closed at a same time as the piezoelectric convertor is mechanical stressed (e.g. compressed) and released.

In order for the apparatus in FIG. 3 to work more efficiently as an energy harvester, the internal capacitance (CF) of the piezoresistive layer 313 may be smaller than CP. The smaller the better for this example. In one example embodiment the piezoelectric convertor layer 312 comprises polyvinylidene difluoride (PVDF) as the piezoelectric material. This may provide a CP piezo-capacitance (intrinsic capacitance of the piezoelectric convertor layer 312) in the order of about 1 nF/cm2. Moreover, the thickness of an average piezoresistive layer may be about 5-10 micrometers, while the polyvinylidene difluoride (PVDF) may be 20-50 micrometers in thickness (capacitance is generally inversely proportional to the dielectric thickness). Finally, the dielectric constant of polyvinylidene difluoride (PVDF) is ~12, while that of insulator/conductor composite is unlikely to be much smaller. Therefore to improve the function of the device the capacitance of the piezoresistive layer may be decreased relative to the piezoelectric convertor layer. Please note that the above are merely examples and should not be considered as limiting.

Figure 4A:
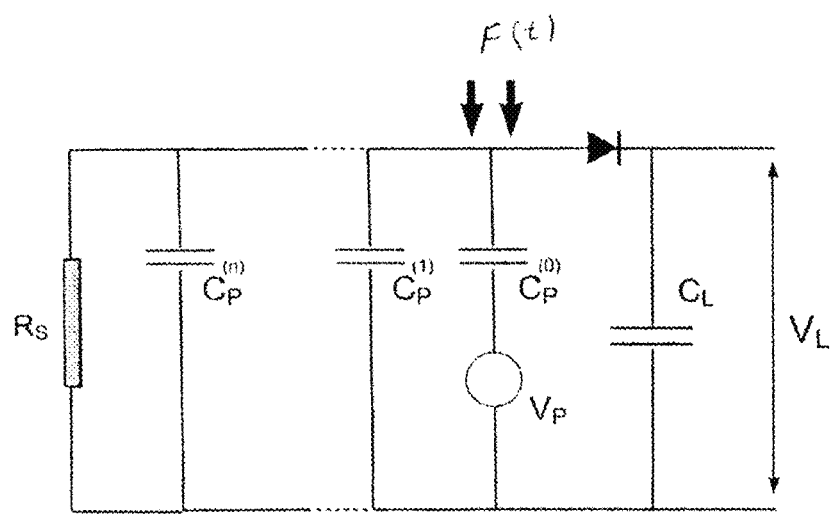
FIGS. 4A and 4B are circuit diagrams illustrating a problem and a solution related to connecting a plurality of the devices shown in FIG. 3A.

When discussing piezoelectric generators based on arbitrary piezoelectric elements and associated rectification circuitry, it is often assumed that the applied stress is distributed uniformly across the entire active area. In many practical energy-harvesting applications, however, the stimulated area is only a fraction of the total surface (e.g., a finger touch on a screen or a footstep on a piezoelectric carpet). If a very localized stress is applied on a large piezoelectric element, one can model the structure as an array of n+1 capacitors in parallel (each having an area equal to the stimulated area), of which only one (0) is driven by the polarization of the piezoelectric material (see FIG. 4A). Let's then assume that the rectification circuitry consists of a single diode on the output line (see FIG. 4B). Here, the n inactive capacitors present a detrimental parasitic capacitance to the signal generated at stage (0). In other words, the charge flowing to/from the capacitor (0) (the driven pixel) will mostly be exchanged with the parasitic capacitors (1)-(n) (the inactive pixels) rather than pumped through the diode; resulting in a much lower energy and voltage output. This is the fundamental problem of piezoelectric touchscreens, as signal amplifiers are needed downstream to detect such a weak output. No self-powering is thus realistically achievable.

To solve this problem, the total area of the generator may be divided into autonomous "pixels" (or tiles). These pixels may each roughly match the lateral size of the stimulus, such as the size of a person's fingertip for example. Each pixel may have their own rectifying circuitry (see FIG. 4B). This way, as pixel (0) is driven, all the parasitic capacitors are cut off by their associated diode, so the only current paths available are through the diode and resistor at stage (0) for the example described above. Indeed, the simulation shown in FIG. 5 confirms that the output voltage $V_L$ is rapidly quenched for the circuit modeled in FIG. 4A as the number of pixels is scaled up as illustrated by 40. Conversely, for the circuit in FIG. 4B, the output voltage $V_L$ is almost independent of the number of pixels as illustrated by 42.

Clearly, in large area touch-panels (especially flexible ones), it is not practical nor cost-effective to implement a diode locally for each pixel. Features as described herein, however, offer the possibility for large scaling by keeping a rectification mechanism in place for each pixel, with a solution as technically cheap and simple as stacking two polymers together.

Figure 6A:
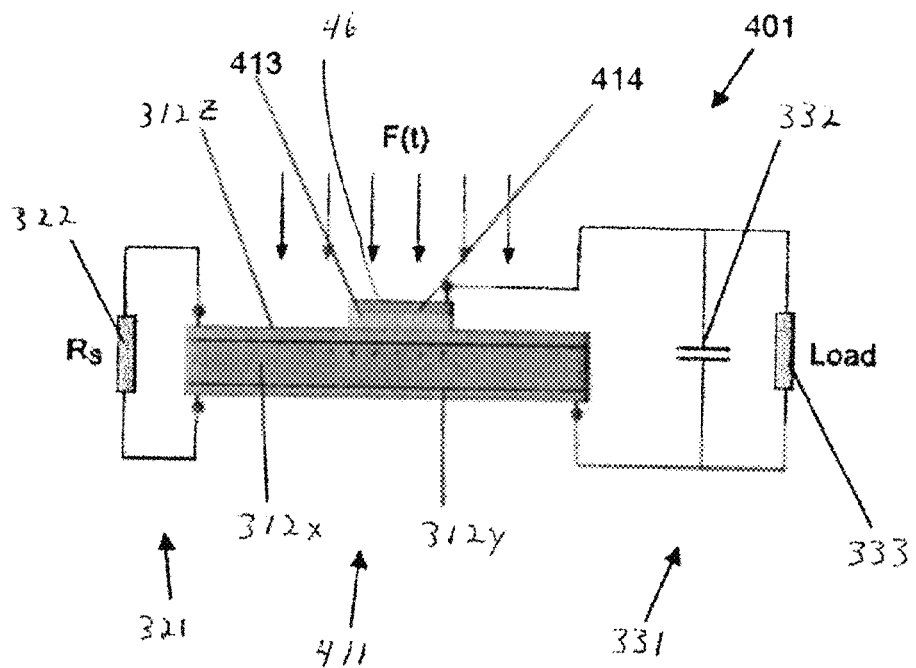
FIG. 6A is a diagram similar to FIG. 3A of a pixel structure.
Figure 6B:
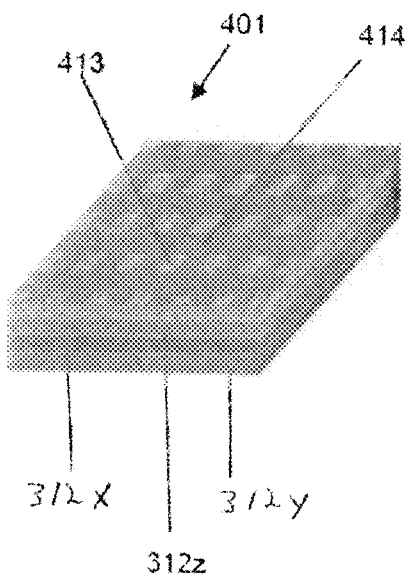
FIG. 6B is a diagram illustrating a plurality of the pixel structures shown in FIG. 6A.

Referring also to FIGS. 6A and 6B, one example 401 is shown of an assembly 411 similar to FIG. 3A, but to reduce the capacitance of the piezoresistive layer relative to the piezoelectric convertor layer 312. As illustrated by this example, this may be accomplished by reducing the area of the piezoresistive layer relative to the corresponding piezoelectric convertor layer 312; thus achieving a corresponding decrease in capacitance. The embodiment of FIG. 6A is the same as FIG. 3A except that the area of the piezoresistive layer 413 is reduced compared with the area of the piezoelectric convertor layer 312. Likewise, the conducting layer 414, which enables an electrical connection between the positive piezoresistive layer and other circuit portions, is correspondingly reduced in size. This approach may be particularly effective in some cases (e.g. touchpanel pixels). It will be appreciated that the smaller piezoresistive layers may be positioned such that the same applied stress which activates the piezoelectric convertor layer also activates the change of resistance in the piezoresistive later. Likewise, the piezoresistive layer area should not be made so small that the resistance of the layer is too large to enable current to pass when in a conducting state.

Figure 4B:
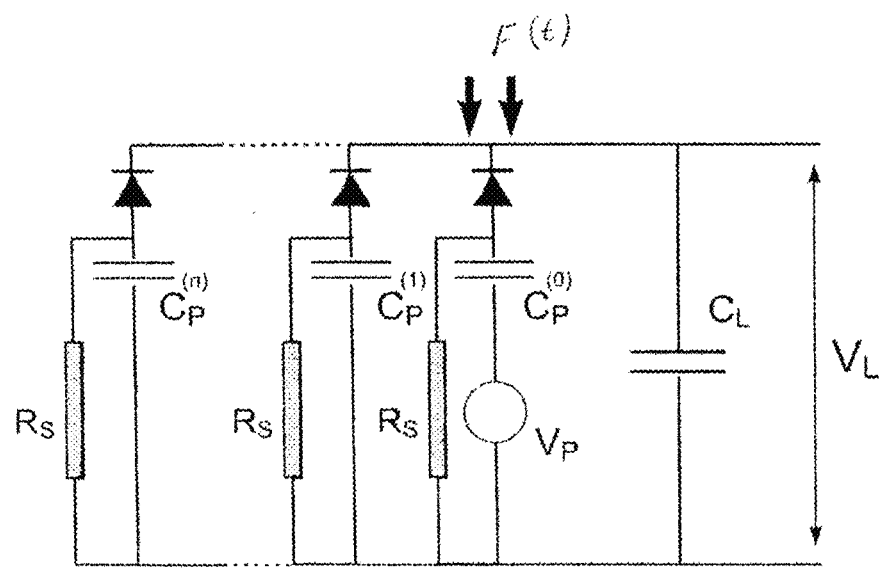
Figure 5:
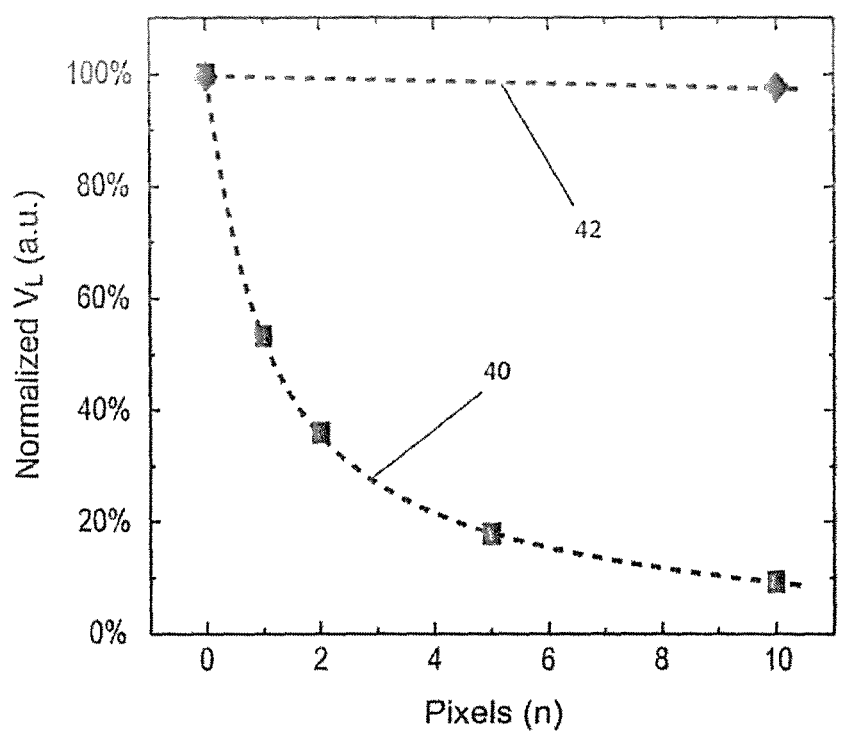
FIG. 5 is a chart illustrating a comparison of the two different scenarios of FIGS. 4A and 4B as more pixel are added.

It will be appreciated that a number of piezoresistive layer "pixels" may be arranged with the piezoelectric convertor layer 412 as shown in FIG. 4B (e.g. forming a grid). This may allow the system to work effectively even if the pressure is not applied uniformly over the whole device area. The geometry of the grid may have an impact on a low capacitance and a low ON resistance for the piezoresistive layer, and may allow large enough currents to be supported. The size and spacing of the discrete pixels depend on the application. For example, pixels for a touchscreen may be in the 1-10 mm range, with spacing between adjacent pixels of between 1 micron-1 mm. Discrete pixels for a carpet footfall energy harvester, as another example, may be up to several tens of cm with large spaces between adjacent discrete pixels (e.g. up to 1 meter for example). Please note that these are merely examples and should not be considered as limiting.

From the discussion above, a value of resistor $R_S$ in the 0.1-1000 Mohm range may be optimal for most applications. To implement $R_S$, even in a fully integrated "soft" (e.g. a flexible, stretchable, and/or deformable) device the two conducting layers of the piezoelectric convertor layer may be connected with a piece of highly resistive polymer or conductive adhesive tape for example.

Features as described herein may be used for a self-powered touch-panel from an arrays of integrated piezoelectric generators. An integrated piezoelectric building block potentially exploitable for energy harvesting and sensing applications is described in International Patent Application Number PCT/IB2012/055384 which is hereby incorporated by reference in its entirety. Features as described herein may exploit this technology for a specific application, such as a self-powered touch-panel for example. It may be preferable to use the term "touch-panel" rather than "touch-screen", so not to imply any constrain in size or deformability of the apparatus. A creative step, thus, does not lie on the materials and fabrication of the core building block, but rather on the architecture(s) by which many of these building block may be assembled together to accomplish a specific function.

For portable hand-held devices, such as smartphones and tablet computers for example, the two most popular solutions for input have been resistive touchscreens and capacitive touchscreens. A major benefit of resistive touch technology is its fabrication simplicity and low cost. In the past, a big disadvantage of a resistive touchscreens was that it does not support multi-touch. Capacitive touchscreens, on the other hand, can be fabricated as an array of pixels with independent readout, thus supporting multi-touch events. Features as described herein may be used to provide "pixels" with a resistive touchscreen. This can then allow a resistive touchscreen which does support multi-touch. Both technologies require a constant supply of external power to work, making the touchscreen a power-hungry functionality in a mobile device. Self-powered touchscreens comprising one or more generators as described herein would solve this touchscreen power-hungry functionality problem (or at least partially solve this problem with an at least partially self-powered touchscreen).

Figure 8:
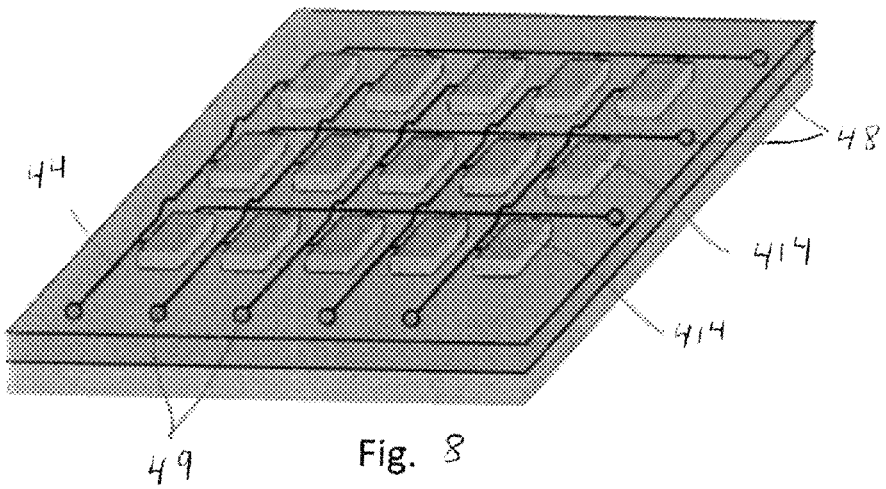
FIG. 8 is a diagram similar to FIG. 7 but showing a problem with an alternate design.
Figure 7:
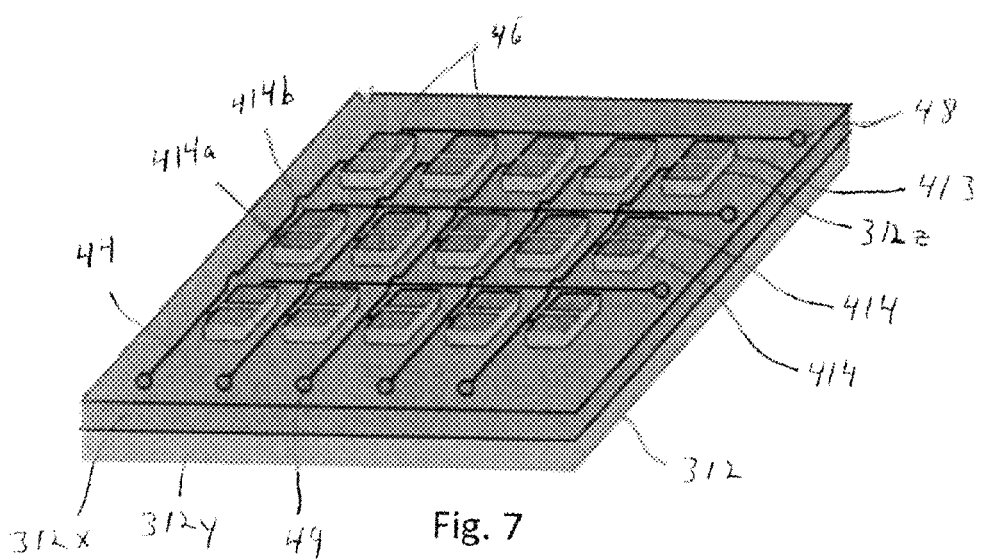
FIG. 7 is a diagram illustrating one example of a crossbar architecture used to connect pixels.

Referring also to FIG. 7, an example embodiment is shown of conductors in a crossbar architecture 44 connected to pixels 46 formed with a piezoresistive layer 413. The piezoresistive layer, shown as a plurality of members 413, has a plurality of spaced apart piezoresistive electrodes 414. In this example, each pixel 46 has an electrode 414 with two spaced electrode pads 414a, 414b on top of the piezoresistive layer 413. The purpose of using a crossbar architecture is to output the DC current locally generated by an IPG (in individual pixel 46) under pressure to one of the row nodes 48 and one of the column nodes 49, for uniquely identifying the planar coordinates of the touch event on that pixel. One basic example embodiment is illustrated in FIG. 7. Here, the device is composed of a continuous bottom electrode 312y, a continuous piezoelectric film 312x, a patterned middle electrode 312z in the form of a pixelated structure, a piezoresistive film 413 (shown patterned here, but may be continuous), and patterned top electrodes 414. The patterned top electrode 414 of each pixel 46 is made of two electrically isolated pads 414a, 414b, each connected to a corresponding row node 48 and a corresponding column node 49, respectively, by the crossbar architecture 44. In one example, the pressure may be applied uniformly over an individual pixel 46, so the output provided by the two independent top electrode pads 414a, 414b is almost identical. It is necessary to split the column and row pads 414a, 414b because, as shown by FIG. 8, a single continuous pad 414 with a dual output (row and column) would simply short all nodes together.

Figure 9:
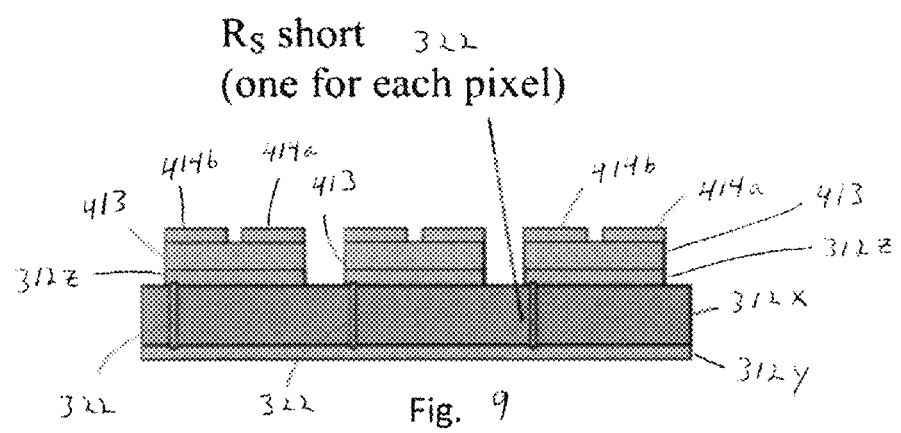
FIG. 9 is a schematic cross section of the example shown in FIG. 7.
Figure 10:
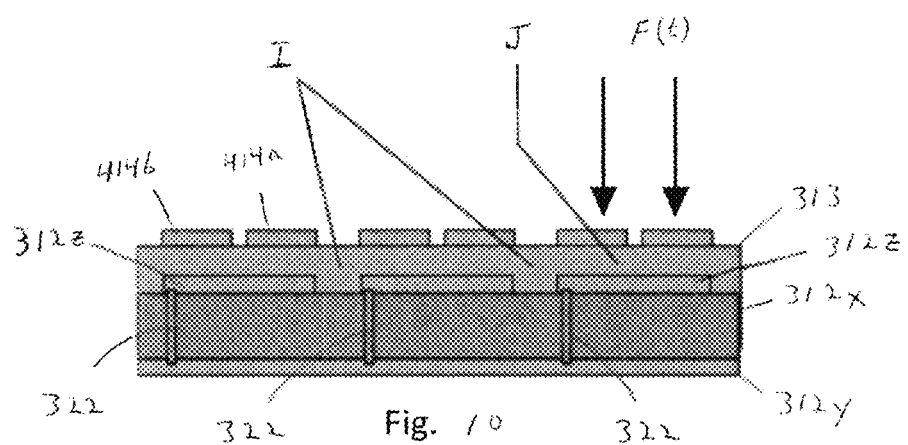
FIG. 10 is a schematic cross section as in claim 9, but showing an alternate construction of the piezoresistive layer.

The cross sections in FIGS. 9 and 10 help to understand why the embodiments with a patterned piezoresistive layer 413 (FIG. 9) or a continuous piezoresistive layer 313 (FIG. 10) are basically electrically equivalent. Indeed, since the piezoresistive layer 313, 413 is an insulator that becomes conductive only where pressed, no current can flow through the continuous piezoresistive layer 313 from the active pixel (under stress) to its inactive neighbors (while the piezoresistive layer is at rest). The areas I shown in FIG. 10 form insulator regions, and the areas J shown in FIG. 10 form conductor regions. Hence, in practice, a continuous piezoresistive film is the simplest and, thus, perhaps a preferable embodiment. A continuous piezoresistive film may be used in any type of embodiment rather than a patterned piezoresistive film.

FIGS. 9 and 10 also show an example implementation for the short resistor (RS) 322. As FIGS. 9-10 reveal, each pixel may be connected to the bottom electrode 312y through a relatively large resistor 322 (such as 1-1000 MOhm for example). These example embodiments involve the implementation of vertical resistors 322 passing through the piezoelectric film itself 312x. The approach to follow in this case is twofold. If the piezoelectric material of choice is intrinsically a poor conductor (such as ZnO for example), a suitable $R_S$ is naturally provided. Note that, for realistic pixel sizes around 1 mm or more, the vertical resistance across a few-µm-thick piezoelectric film dominates over the lateral resistance, namely, all pixels can still be treated as electrically independent. On the other hand, if the piezoelectric material of choice is a good insulator, it may be engineered into a composite with conducting micro-fibers or nano-fibers (e.g., carbon nanotubes or metallic nanowires like Au or Ag), so that a few internal percolation paths could allow the transmission of some current across the film.

Figure 11:
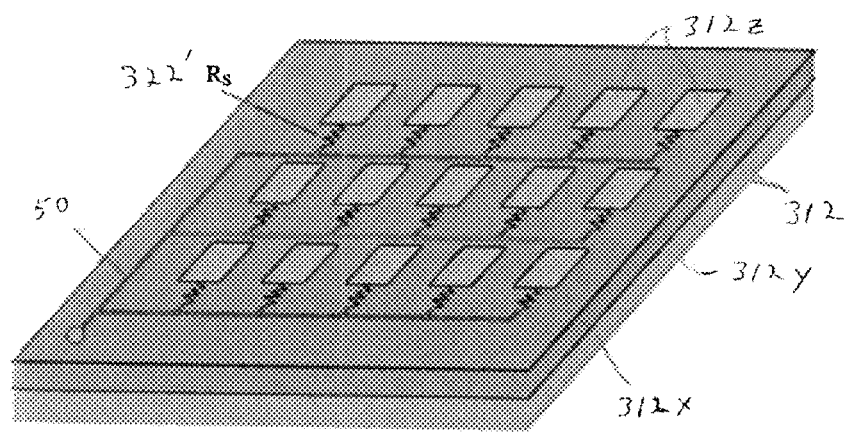
FIG. 11 is a diagram illustrating an example of an alternate resistor embodiment from that shown in FIGS. 9-10.
Figure 12:
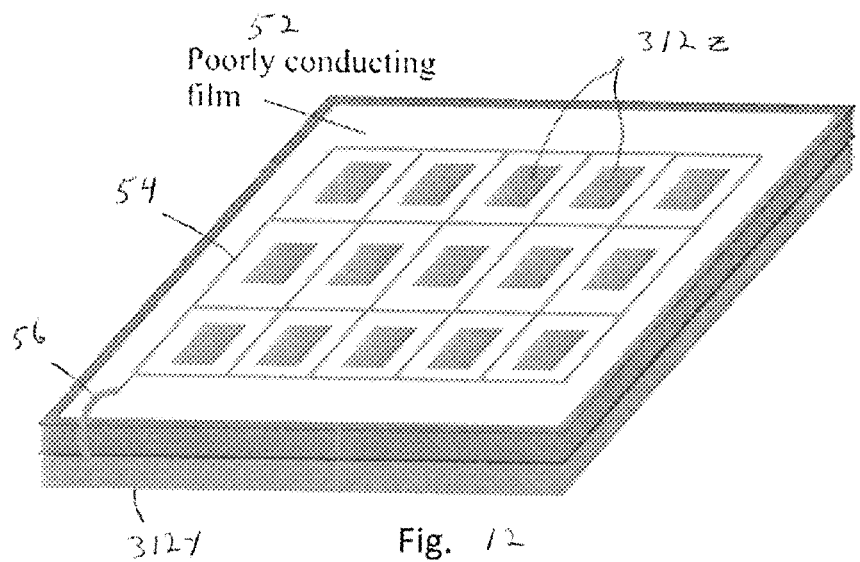
FIG. 12 is a diagram similar to FIG. 11 showing a conductor grid and short.

It is also possible, however, to implement these resistors via some planar circuitry in between individual pixels. In principle, individual $R_S$ resistors should be implemented for all pads forming the second metallic layer and then connected to the first metallic layer. An example of this is shown in FIG. 11. The planar circuitry 50 may comprise resistors 322' ($R_S$) on the piezoelectric layer 312x and connected to the individual conducting plates 312z. The piezoresistive film 313, 413 and the electrodes of the third metallic layer 414 are not shown in FIG. 11 merely for the sake of clarity. The simplest way to realize this configuration would be to use a poorly conductive film 52 to connect all pads 312z of the second metallic layer, and then short 56 such film to the first metallic layer 312y via a grid 54 intertwined with all pads as illustrated by the example in FIG. 12. The grid geometry ensures that, for an individual pad 312z, the electrical path to ground is less resistive than to neighbor pads; thereby limiting parasitic effects.

Figure 13:
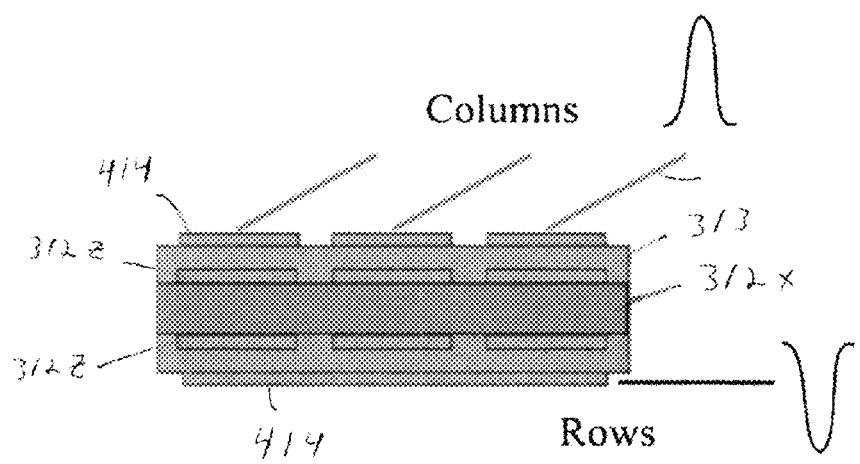
FIG. 13 is a schematic sectional view of an alternate example embodiment.
Figure 14:
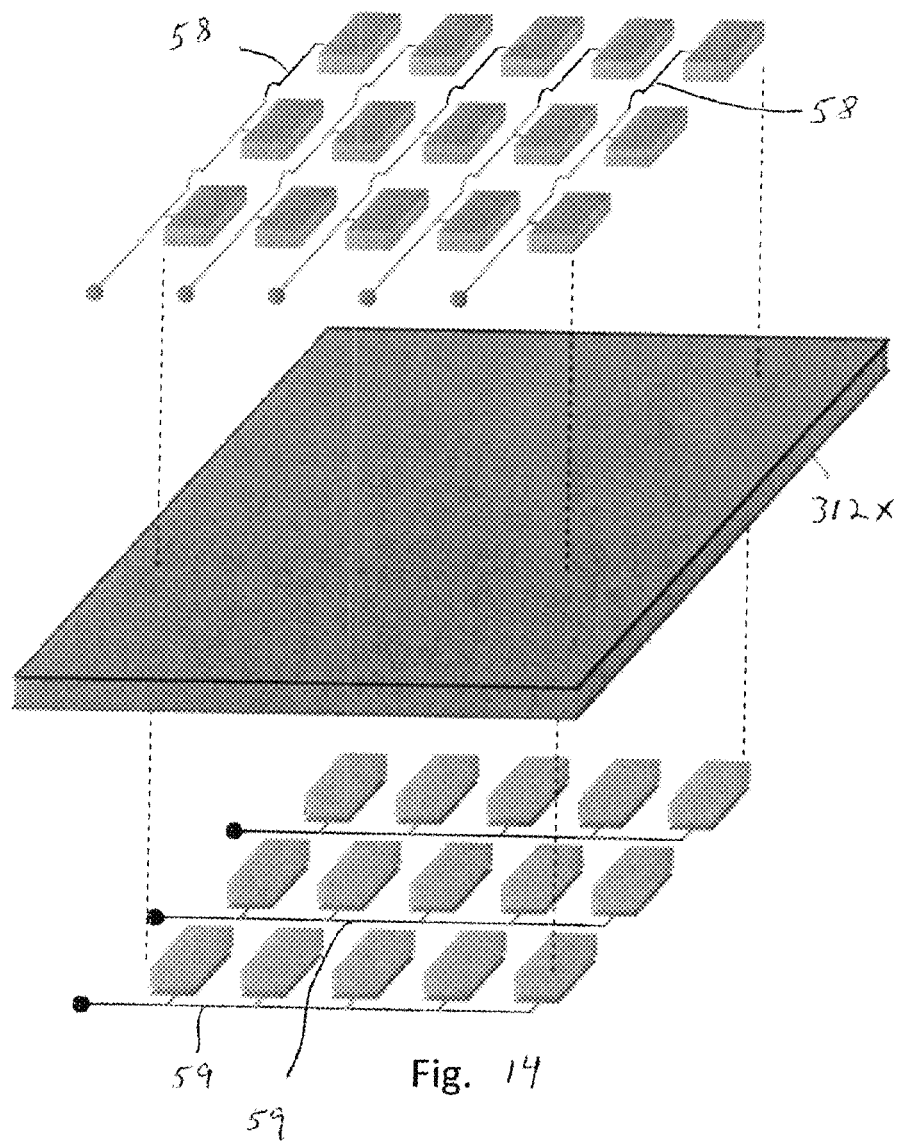
FIG. 14 is an exploded perspective view of the example shown in FIG. 13.

For all the following example embodiments, the resistor $R_S$ is assumed to be embedded within the piezoelectric film itself, hence it is no longer drawn in the figures. In another example embodiment illustrated in FIGS. 13-14, the crossbar architecture is composed by an array of columns of conductors 58 fabricated on the top-side of the piezoelectric film 312x and by an array of perpendicular rows of conductors 59 fabricated on the bottom-side of the piezoelectric film 312x. Accordingly, the DC signal produced by a column node following a touch event will take the form of a positive peak, whereas the associated DC signal produced by a row node will take the form of a negative peak (or vice-versa, according to the orientation and polarity of the piezoelectric film). Note that, in the exploded perspective representation shown in FIG. 14, the stack order of the IPGs on the bottom side of the piezoelectric film 312x is reversed, i.e., the contact pads connected to the row nodes are the layer at the very bottom. This obviates a need to split the pads for the embodiment in FIG. 7, making the output less sensitive to a non-homogeneous applied stress within the same pixel.

Figure 15:
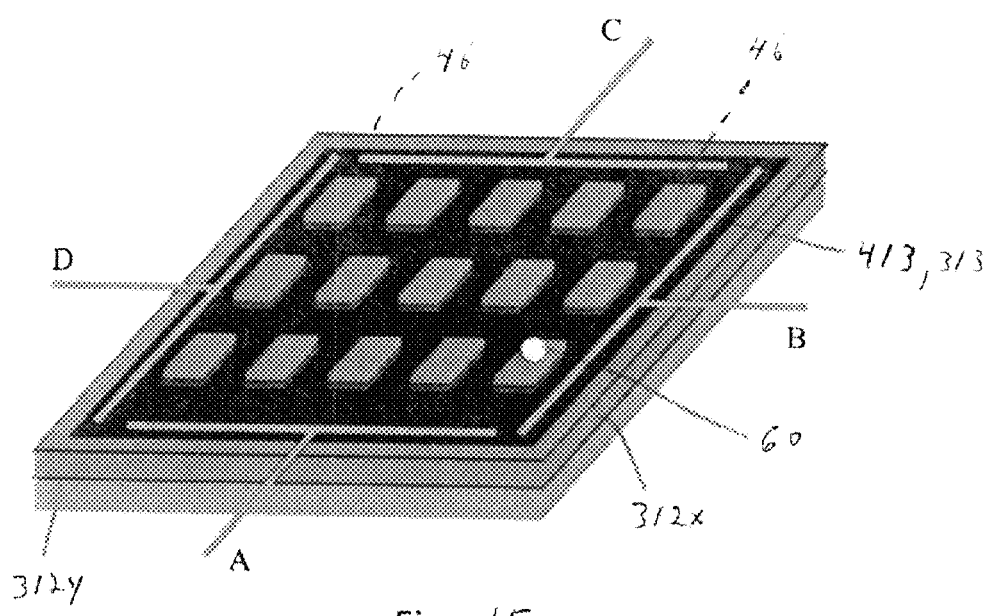
FIG. 15 is a schematic view of an alternate example embodiment.

Similar to what happens in resistive touchscreens, the planar location of a touch event can be determined by observing how the current generated by an active IPG is split across paths of different resistance (resistive mapping). The basic embodiment is illustrated in FIG. 15. Here, the device is composed of a continuous bottom electrode 312y, a continuous piezoelectric film 312x, a patterned middle electrode in the form of a pixelated electrode structure (as mentioned above, it is assumed the piezoelectric film provides the short resistor $R_S$ connecting the bottom and middle electrode), a piezoresistive film (patterned 413 OR continuous 313), and a continuous top electrode made of a film (e.g., carbon film) whose in-plane resistance is higher than that of a metal (0.1-10 KOhm would make a suitable range. This resistance should still be $<<R_S$). Then, metallic electrodes are connected to the film edges and provide the four outputs A-D. When a pixel is pressed, for example the corner one marked by the dot 60, the current generated by that IPG flows through the resistive top electrode towards all outputs A-D, but clearly the current measured at terminals A and B will be higher than that measured at C and D. With a suitable calibration, accurate spatial mapping is possible.

Figure 17:
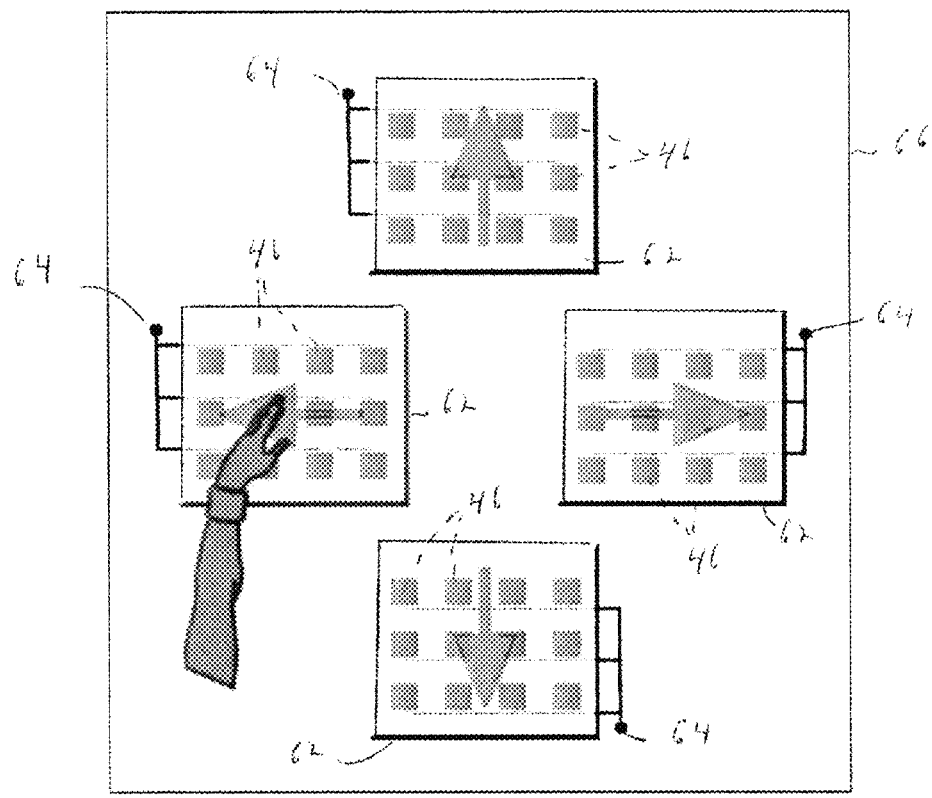
FIG. 17 is a top view of an alternate example embodiment comprising a plurality of the devices shown in FIG. 16.
Figure 16:
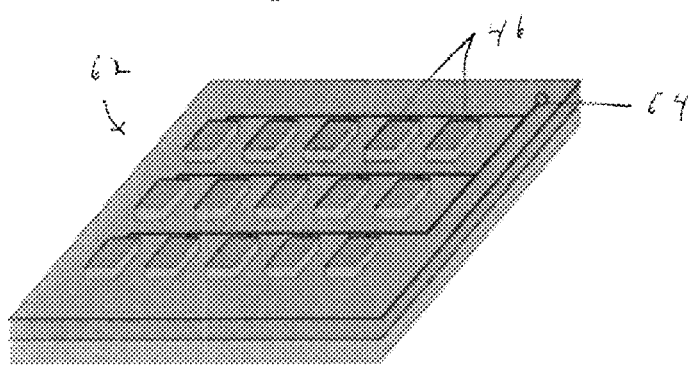
FIG. 16 is a schematic sectional view of an alternate example embodiment.
Figure 18:
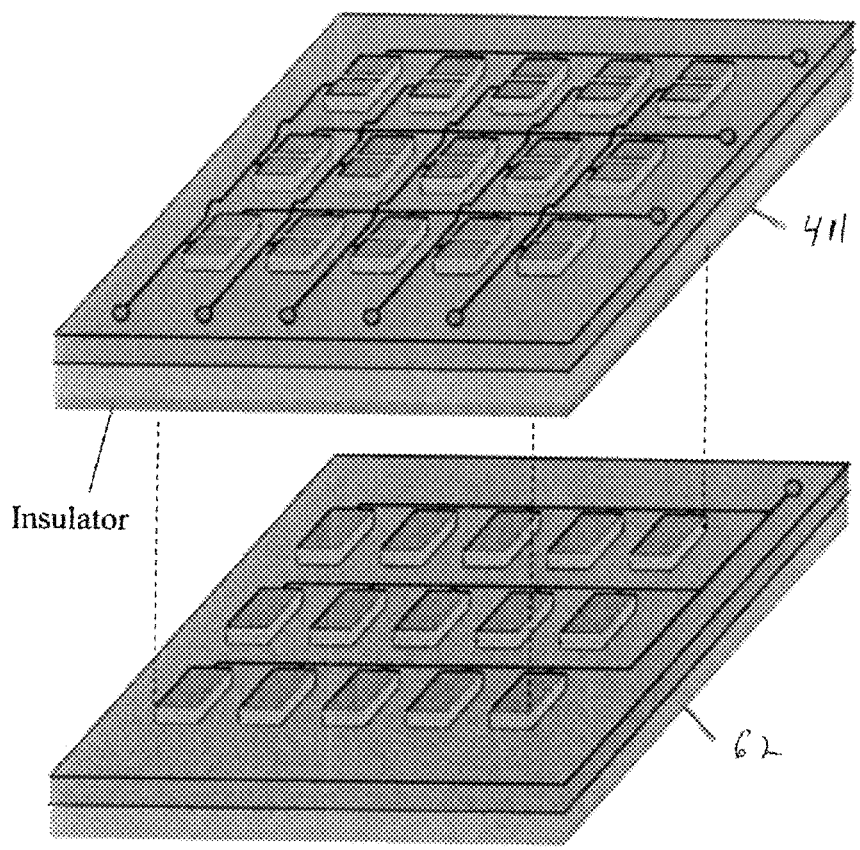
FIG. 18 is a schematic exploded perspective view of an alternate example embodiment.

There might be embodiments based on spatially-unresolved collective output. For example, an embodiment may comprise a case where a large-area, self-powered touch sensor would be useful even without the need to resolve the planar coordinates of the touch event (for the sake of example, a knock on any point of a door makes a bell ring inside). Alternatively, there might be cases where a large-area touch sensor only needs a few "big buttons", which are larger than the stimulus pressure spot. For any of these "big buttons", with Boolean output the same considerations explained above may apply. Namely, to maximize power generation and output a strong signal, the area of the active IPG may roughly match that of the applied stimulus (likely a human finger). As illustrated by FIG. 16, a single button 62, therefore, may not be made of a single IPG but rather of an array of IPGs 46 with a single collective output 64 connected to all top-electrodes. This may mimic the equivalent circuit illustrated in FIG. 4B (capacitor excluded). Here, no matter which pixel 46 is pressed, the same maximum output is always collected at 64 for each button 62. FIG. 17 schematically illustrates a meaningful implementation. In this example the apparatus 66 comprises four buttons 62. Each button 62 has an array of IPGs 46 with its own respective collective output 64.

To further stress the broad applicability of this embodiment, we suggest another example. Consider a house where a CPU detects people roaming across different rooms from their steps on a self-powered piezoelectric carpet. Here, each room is a separate individual pixel with Boolean output (room is either empty or occupied), but within a single room the floor area is much larger than a single stimulus footprint. The piezoelectric carpet for an individual room may than be composed of an array of IPG "tiles" with a common collective output, as in FIG. 17, and with the area of a single tile roughly matching the average footprint size.

In all embodiments considered so far, the use of a single piezoelectric film was always assumed. Since such films are often very thin (e.g., PVDF), there might not be in practice severe constraints in term of thickness, deformability or transparency that hinder the possibility of stacking several layers on top of each other. If this is the case, some architectures can be combined to boost the total generation of energy while maintaining the positional selectivity for a touch event. The simplest combination of all would be to stack a position-selective architecture (as illustrated in FIG. 7) for example, over a position-non-selective one (or more than one) as illustrated by 62 in FIG. 16 with a single collective output 64. The energy from 62 can be used to further amplify the signal from 411, or just stored for some alternative use in parallel to touch sensing.

The example embodiment detailed herein are presented in a general way so as not to limit their applicability. However, a few applications for technologies may include the following:

| Application | Key features exploited |
| --- | --- |
| High-resolution touch interface for portable devices or screens | Self-powered; Small isolated pixels |
| Rudimental touch interface for fixed large surfaces (e.g., desks, chairs, doors, windows, walls, floors, etc.) | Self-powered; Large-area; Transparency |
| Impact spot detector (e.g., lines on a tennis court as a cheap widespread alternative to expensive "hawk-eye" technologies; a rain sensor potentially measuring average raindrop density, energy, and size; etc.) | Self-powered; Large-area; Small isolated pixels |
| Electronic skin, intended as a conformal coating applied to arbitrary objects which enables spatially-resolved pressure sensitivity (e.g., pressure- or impact-sensitive clothing). | Self-powered; Large-area; Small isolated pixels; Flexibility |
| Mechanical energy harvesting (e.g., stress, vibrations, etc.) | Self-powered; Large-area; Flexibility |
| Mechanical energy harvesting (e.g., stress, vibrations, etc.) | Self-powered; Large-area; Flexibility |

Advantages of some of the features as described herein include:
Self-powered
Small isolated pixels
Large-area
Flexibility
Transparency Concerning flexibility and transparency, those are not necessarily granted by the core technology building block (IPG). They may be achieved, if needed, provided that a flexible and/or transparent version of all layers is chosen. For example, PVDF is a flexible and transparent piezoelectric element. Metallic layers may be made of a deformable and transparent conductor (e.g. graphene or graphene ink). The piezoresistive layer may also be flexible and transparent.

With features as described herein, a functional architecture may be provided to assemble arrays of integrated piezoelectric generators (IPG) (such as described in International Patent Application Number PCT/IB2012/055384 for example), so to construct a new generation of touch-panels which may spatially resolve (identify a location of) a touch event while also internally generating the power to output the corresponding DC signal. With features as described herein, this may be done more simply and efficiently than ever realized before.

Features as described herein may be used with:
A. An array of IPGs where individual pixels are resolved by means of a crossbar architecture.
B. Two arrays of IPGs fabricated on either side of a piezoelectric film, where individual pixels are resolved by combining the row and column coordinates generated by these complementary arrays.
C. A stack of two arrays of IPGs fabricated on two independent piezoelectric films, where individual pixels are resolved by combining the row and column coordinates generated by these complementary arrays.
D. An array of IPGs where individual pixels are resolved (location identified) by analyzing how the current generated by a single touch event is split through a resistive film across opposite electrodes (similarly to conventional resistive touchscreens, but with the current being generated internally).
E. An array of IPGs where individual pixels are not individually resolved, but offer a similar collective output no matter which element of the array has been touched or pressed.
F. A stack of two (or more) arrays of IPGs fabricated on two (or more) independent piezoelectric films, where individual pixels are resolved by means of an architecture as for A-D, and additional energy is generated by the remaining collective-output architectures as for E.
G. An apparatus as for A-F where the piezoelectric film is, or is engineered to be, a poor conductor rather than an insulator. This is to be intended as a film with an electrical resistance in the perpendicular direction on the order of 1-1000 MOhm/cm2.

One type of example embodiment may be provided in an apparatus comprising a piezoelectric convertor layer; at least one piezoresistive layer on the piezoelectric convertor layer, where the at least one piezoresistive layer comprises a plurality of spaced apart piezoresistive electrodes, where the apparatus is configured such that when the piezoelectric convertor layer is deformed to generate a charge, at least one of the piezoresistive electrodes is stressed, where the at least one piezoresistive layer is configured to control flow of charge from the piezoelectric convertor layer; and electrical conductor outputs electrically connected to the piezoresistive electrodes, where the outputs are configured to allow the charge from the piezoelectric convertor layer to flow out of the piezoresistive electrodes, where the electrical conductor outputs are configured relative to the piezoresistive electrodes to allow identification of the at least one piezoresistive electrode which has been stressed based upon the charge on at least one of the electrical conductor outputs.

The electrical conductor outputs may comprise a crossbar architecture. The apparatus may be configured such that when the piezoelectric convertor layer is deformed to generate the charge, at least two of the piezoresistive electrodes are stressed, where each of the at least two piezoresistive electrodes are connected to a different one of the electrical conductor outputs. The at least two piezoresistive electrodes may be located on a first face of the piezoelectric convertor layer with a piezoresistive material between the at least two piezoresistive electrodes and the piezoelectric convertor layer. The piezoresistive material may comprise a continuous film between the at least two piezoresistive electrodes and the piezoelectric convertor layer. The electrical conductor outputs may comprise columns and rows of the outputs. The apparatus may further comprise a plurality of resistors connecting a first conducting layer of the piezoelectric convertor layer to a second conducting layer of the piezoelectric convertor layer through a piezoelectric layer of the piezoelectric convertor layer. Pixels may be formed under the piezoresistive electrodes, and where the apparatus further comprises a plurality of resistors connecting a first conducting layer of the piezoelectric convertor layer to a second conducting layer of the piezoelectric convertor layer, where the resistors are formed on a planar circuit in between the pixels. The at least one piezoresistive layer may comprise a first piezoresistive layer on a first side of the piezoelectric convertor layer and a second piezoresistive layer on a second different side of the piezoelectric convertor layer. The electrical conductor outputs may comprise a first set of the outputs on the first side of the piezoelectric convertor layer and a second different set of the outputs on the second side of the piezoelectric convertor layer. The apparatus may comprise means for resistive mapping of location of the at least one piezoresistive electrode which has been stressed. The apparatus may further comprise a second piezoelectric convertor layer and a second piezoresistive layer stacked with the piezoelectric convertor layer and the at least one piezoresistive layer in an assembly. The apparatus may further comprise means for identifying which of the at least one first piezoresistive electrodes has been stressed based, at least partially, upon the charge flowing through the at least one first piezoresistive electrode, which has been stressed, from the piezoelectric convertor layer.

An example method may comprise providing a piezoelectric convertor layer; providing at least one piezoresistive layer in electrical communication with the piezoelectric convertor layer, where the at least one piezoresistive layer comprises a plurality of discrete, spaced apart piezoresistive electrodes, such that when the piezoelectric convertor layer is deformed to generate a charge, at least one of the piezoresistive electrodes is stressed for the piezoresistive layer to control flow of charge from the piezoelectric convertor layer; and providing a plurality of separate electrical outputs from the piezoresistive electrodes, where a first one of the outputs is connected to at least two of the piezoresistive electrodes and a second one of the outputs is connected to at least two different ones of the piezoresistive electrodes.

Providing the plurality of separate electrical outputs may comprise forming the electrical outputs as a crossbar architecture. When the piezoelectric convertor layer is deformed to generate the charge, at least two of the piezoresistive electrodes may be stressed, where each of the at least two piezoresistive electrodes are connected to a different one of the electrical outputs. The method may further comprise providing a plurality of resistors connecting a first conducting layer of the piezoelectric convertor layer to a second conducting layer of the piezoelectric convertor layer through a piezoelectric layer of the piezoelectric convertor layer. Pixels may be formed under the piezoresistive electrodes, and where the method further comprises a plurality of resistors connecting a first conducting layer of the piezoelectric convertor layer to a second conducting layer of the piezoelectric convertor layer, where the resistors are formed on a planar circuit in between the pixels. Providing at least one piezoresistive layer may comprise providing a first piezoresistive layer on a first side of the piezoelectric convertor layer and a second piezoresistive layer on a second different side of the piezoelectric convertor layer.

One type of example apparatus may comprise a piezoelectric convertor layer; a first piezoresistive layer which is in electrical communication with a first face of the piezoelectric convertor layer, where the first piezoresistive layer comprises a plurality of discrete, spaced apart first piezoresistive electrodes, where the apparatus is configured such that when the piezoelectric convertor layer is deformed to generate a charge, at least one of the first piezoresistive electrodes is stressed such that the first piezoresistive layer controls flow of charge from the piezoelectric convertor layer; and a plurality of separate electrical outputs from the first piezoresistive electrodes, where a first one of the outputs is connected to at least two of the first piezoresistive electrodes and a second one of the output is connected to at least two different ones of the first piezoresistive electrodes.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
   a piezoelectric convertor layer;
   at least one piezoresistive layer on the piezoelectric convertor layer, where the at least one piezoresistive layer comprises a plurality of spaced apart piezoresistive electrodes, where the apparatus is configured such that when the piezoelectric convertor layer is deformed to generate a charge, at least one of the piezoresistive electrodes is stressed, where the at least one piezoresistive layer is configured to control flow of charge from the piezoelectric convertor layer; and
   electrical conductor outputs electrically connected to the piezoresistive electrodes, where the outputs are configured to allow the charge from the piezoelectric convertor layer to flow out of the piezoresistive electrodes, where the electrical conductor outputs are configured relative to the piezoresistive electrodes to allow identification of the at least one piezoresistive electrode which has been stressed based upon the charge on at least one of the electrical conductor outputs.

2. An apparatus as in claim 1 where the electrical conductor outputs comprise a crossbar architecture.

3. An apparatus as in claim 1 where the apparatus is configured such that when the piezoelectric convertor layer is deformed to generate the charge, at least two of the piezoresistive electrodes are stressed, where each of the at least two piezoresistive electrodes are connected to a different one of the electrical conductor outputs.

4. An apparatus as in claim 3 where the at least two piezoresistive electrodes are located on a first face of the of the piezoelectric convertor layer with a piezoresistive material between the at least two piezoresistive electrodes and the piezoelectric convertor layer.

5. An apparatus as in claim 4 where the piezoresistive material comprises a continuous film between the at least two piezoresistive electrodes and the piezoelectric convertor layer.

6. An apparatus as in claim 1 where the electrical conductor outputs comprise columns and rows of the outputs.

7. An apparatus as in claim 1 further comprising a plurality of resistors connecting a first conducting layer of the piezoelectric convertor layer to a second conducting layer of the piezoelectric convertor layer through a piezoelectric layer of the piezoelectric convertor layer.

8. An apparatus as in claim 1 where pixels are formed under the piezoresistive electrodes, and where the apparatus further comprises a plurality of resistors connecting a first conducting layer of the piezoelectric convertor layer to a second conducting layer of the piezoelectric convertor layer, where the resistors are formed on a planar circuit in between the pixels.

9. An apparatus as in claim 1 where the at least one piezoresistive layer comprises a first piezoresistive layer on a first side of the piezoelectric convertor layer and a second piezoresistive layer on a second different side of the piezoelectric convertor layer.

10. An apparatus as in claim 9 where the electrical conductor outputs comprise a first set of the outputs on the first side of the piezoelectric convertor layer and a second different set of the outputs on the second side of the piezoelectric convertor layer.

11. An apparatus as in claim 1 where the apparatus comprises means for resistive mapping of location of the at least one piezoresistive electrode which has been stressed.

12. An apparatus as in claim 1 further comprising a second piezoelectric convertor layer and a second piezoresistive layer stacked with the piezoelectric convertor layer and the at least one piezoresistive layer in an assembly.

13. An apparatus as in claim 1 further comprising means for identifying which of the at least one first piezoresistive electrodes has been stressed based, at least partially, upon the charge flowing through the at least one first piezoresistive electrode, which has been stressed, from the piezoelectric convertor layer.

14. A method comprising:
    providing a piezoelectric convertor layer;
    providing at least one piezoresistive layer in electrical communication with the piezoelectric convertor layer, where the at least one piezoresistive layer comprises a plurality of discrete, spaced apart piezoresistive electrodes, such that when the piezoelectric convertor layer is deformed to generate a charge, at least one of the piezoresistive electrodes is stressed for the piezoresistive layer to control flow of charge from the piezoelectric convertor layer; and
    providing a plurality of separate electrical outputs from the piezoresistive electrodes, where a first one of the outputs is connected to at least two of the piezoresistive electrodes and a second one of the outputs is connected to at least two different ones of the piezoresistive electrodes.

15. A method as in claim 14 where providing the plurality of separate electrical outputs comprises forming the electrical outputs as a crossbar architecture.

16. A method as in claim 14 where, when the piezoelectric convertor layer is deformed to generate the charge, at least two of the piezoresistive electrodes are stressed, where each of the at least two piezoresistive electrodes are connected to a different one of the electrical outputs.

17. A method as in claim 14 further comprising providing a plurality of resistors connecting a first conducting layer of the piezoelectric convertor layer to a second conducting layer of the piezoelectric convertor layer through a piezoelectric layer of the piezoelectric convertor layer.

18. A method as in claim 14 where pixels are formed under the piezoresistive electrodes, and where the method further comprises a plurality of resistors connecting a first conducting layer of the piezoelectric convertor layer to a second conducting layer of the piezoelectric convertor layer, where the resistors are formed on a planar circuit in between the pixels.

19. A method as in claim 14 where providing at least one piezoresistive layer comprises providing a first piezoresistive layer on a first side of the piezoelectric convertor layer and a second piezoresistive layer on a second different side of the piezoelectric convertor layer.

20. An apparatus comprising:
   a piezoelectric convertor layer;
   a first piezoresistive layer which is in electrical communication with a first face of the piezoelectric convertor layer, where the first piezoresistive layer comprises a plurality of discrete, spaced apart first piezoresistive electrodes, where the apparatus is configured such that when the piezoelectric convertor layer is deformed to generate a charge, at least one of the first piezoresistive electrodes is stressed such that the first piezoresistive layer controls flow of charge from the piezoelectric convertor layer; and
   a plurality of separate electrical outputs from the first piezoresistive electrodes, where a first one of the outputs is connected to at least two of the first piezoresistive electrodes and a second one of the output is connected to at least two different ones of the first piezoresistive electrodes.

* * * * *